(12) United States Patent
Liu

(10) Patent No.: US 12,400,579 B2
(45) Date of Patent: Aug. 26, 2025

(54) LIGHT-EMITTING MODULE, CONTROL METHOD THEREOF, AND DISPLAY MODULE

(71) Applicant: TCL CHINA STAR OPTOELECTRONICS TECHNOLOGY CO., LTD., Shenzhen (CN)

(72) Inventor: Jinfeng Liu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/925,712

(22) PCT Filed: Aug. 30, 2022

(86) PCT No.: PCT/CN2022/115993
§ 371 (c)(1),
(2) Date: Nov. 16, 2022

(87) PCT Pub. No.: WO2024/026957
PCT Pub. Date: Feb. 8, 2024

(65) Prior Publication Data
US 2025/0078725 A1     Mar. 6, 2025

(30) Foreign Application Priority Data
Aug. 5, 2022   (CN) .......................... 202210936649.9

(51) Int. Cl.
*G09G 3/32*     (2016.01)
*H01L 25/16*    (2023.01)

(52) U.S. Cl.
CPC ............. *G09G 3/32* (2013.01); *H01L 25/167* (2013.01); *G09G 2310/0297* (2013.01)

(58) Field of Classification Search
CPC . H01L 25/167; G09G 2310/0297; G09G 3/32
See application file for complete search history.

(56) References Cited

U.S. PATENT DOCUMENTS

| 11,749,179 B2 * | 9/2023 | Zou ........................ G09G 3/006 |
| | | 345/206 |
| 2002/0135543 A1 | 9/2002 | Kitamura et al. |

(Continued)

FOREIGN PATENT DOCUMENTS

| CN | 205992997 U | 3/2017 |
| CN | 108834268 A | 11/2018 |

(Continued)

OTHER PUBLICATIONS

Chinese Office Action issued in corresponding Chinese Patent Application No. 202210936649.9 dated Aug. 24, 2024, pp. 1-8, 17pp.

(Continued)

*Primary Examiner* — Muhammad N Edun
(74) *Attorney, Agent, or Firm* — The Roy Gross Law Firm, LLC; Roy D. Gross

(57) ABSTRACT

A light-emitting module, a control method of the light-emitting module, and a display module are provided to include a light source layer and a driving layer. The light source layer includes light source groups. Each of the light source groups includes a first sub-light source and a second sub-light source. In the driving layer, the driving chip in each stage includes a first sub-light source pin electrically connected to one of the first sub-light sources and a second sub-light source pin electrically connected to one of the second sub-light sources. The first sub-light source pins and the second sub-light source pins are used for time-division transmission of address signals and display signals.

15 Claims, 4 Drawing Sheets

(56) References Cited

U.S. PATENT DOCUMENTS

2023/0282172 A1* 9/2023 Yin .................. G09G 3/3426
                                                    345/76
2024/0428711 A1* 12/2024 Hao .................. G09G 3/32

FOREIGN PATENT DOCUMENTS

| CN | 109994071 A | 7/2019 |
| CN | 211457461 U | 9/2020 |
| CN | 212342248 U | 1/2021 |
| CN | 114185200 A | 3/2022 |

OTHER PUBLICATIONS

PCT International Search Report for International Application No. PCT/CN2022/115993, mailed on Dec. 19, 2022, 10pp.

PCT Written Opinion of the International Search Authority for International Application No. PCT/CN2022/115993, mailed on Dec. 19, 2022, 8pp.

\* cited by examiner

LIGHT-EMITTING MODULE, CONTROL METHOD THEREOF, AND DISPLAY MODULE

CROSS REFERENCE TO RELATED APPLICATIONS

This application is a National Phase of PCT Patent Application No. PCT/CN2022/115993 having International filing date of Aug. 30, 2022, which claims the benefit of priority of Chinese Application No. 202210936649.9 filed on Aug. 5, 2022. The contents of the above applications are all incorporated by reference as if fully set forth herein in their entirety.

FIELD OF DISCLOSURE

The present application relates to the field of display technology, in particular to the field of display module manufacturing technology, and in particular to a light-emitting module and a control method thereof, and a display module.

DESCRIPTION OF RELATED ART

With higher requirements for the image quality of display screens, technologies such as sub-millimeter light-emitting diodes and micron light-emitting diodes have received extensive attention.

In terms of light-emitting diodes (LEDs) used in light-emitting modules, one or more light-emitting diodes need to be driven by corresponding driving chips to emit light; however, it requires more pins in conventional driving chips to realize transmission of various signals, which leads to high costs of the driving chips.

Therefore, the conventional LED light-emitting module technology has the problem of high costs of the driving chips, which needs to be solved urgently.

SUMMARY

The present application provides a light-emitting module, a control method thereof, and a display module to solve the technical problem of high costs of driving chips in conventional sub-millimeter light-emitting diode (LED) light-emitting module technology.

The present application provides a light-emitting module, including:
a substrate;
a light source layer disposed on the substrate, wherein the light source layer includes a plurality of light source groups, and each of the light source groups includes a first sub-light source and a second sub-light source; and
a driving layer disposed on the substrate, wherein the driving layer includes driving chips cascaded in multiple stages, and each of the driving chips includes a first sub-light source pin electrically connected to a corresponding one of the first sub-light sources and a second sub-light source pin electrically connected to a corresponding one of the second sub-light sources;
wherein the first sub-light source pins and the second sub-light source pins of the driving chips cascaded are configured for time-division transmission of address signals and display signals.

In one embodiment, each of the driving chips is configured to control the first sub-light source pin and the second sub-light source pin of this driving chip to transmit the address signals when powered on.

In one embodiment, each of the driving chips further includes a multiplexing control pin, and the multiplexing control pins of the driving chips cascaded are loaded with an enable signal;
wherein the enable signal controls the first sub-light source pins and the second sub-light source pins of the driving chips cascaded to transmit the address signals or the display signals.

In one embodiment, the driving layer further includes:
a controller electrically connected to the first sub-light source pin of a first-stage driving chip;
wherein the second sub-light source pin of a current-stage driving chip is electrically connected to the first sub-light source pin of a next-stage driving chip; and
wherein when the first sub-light source pins and the second sub-light source pins are used to transmit the address signals, the controller loads the first-stage address signal to the first sub-light source pin of the first-stage driving chip, and the current-stage driving chip is configured to generate a next-stage address signal according to a current-stage address signal and transmit the next-stage address signal to the next-stage driving chip.

In one embodiment, the first sub-light source pin or the second sub-light source pin of a last-stage driving chip is electrically connected to the controller, so that the controller confirms whether the transmission of the address signals is completed.

In one embodiment, when the first sub-light source pins and the second sub-light source pins are configured to transmit the display signals, the controller loads the display signal to the multiplexing control pin of the driving chip in each stage; and wherein in each of the driving chips, according to the address signal corresponding to the current stage, the driving chip drives the corresponding first sub-light source through the first sub-light source pin to emit light and drives the corresponding second sub-light source pin through the second sub-light source pin to emit light.

In one embodiment, each of the light source groups further includes a third sub-light source, and each of the driving chips further includes a third sub-light source pin electrically connected to a corresponding one of the third sub-light sources; and
wherein in each of the driving chips, the third sub-light source pin is disposed between the first sub-light source pin and the second sub-light source pin.

The present application provides a control method for controlling the light-emitting module mentioned above, each of the driving chips further includes a multiplexing control pin; the control method includes:
loading the first-stage address signal to the first sub-light source pin of the first-stage driving chip;
generating the next-stage address signal according to the current-stage address signal, and transmitting the next-stage address signal to the next-stage driving chip;
if the first sub-light source pin or the second sub-light source pin of the last-stage driving chip transmits a signal to the controller for the controller to confirm that the transmission of the address signals of the driving chips cascaded is completed, then the controller loading the display signal to the multiplexing control pin of the driving chip in each stage; and
in each of the driving chips, according to the received address signal of the current stage, acquiring from the display signal the display signal of the current stage to drive the corresponding light source group to emit light.

In one embodiment, before the step of loading the first-stage address signal to the first sub-light source pin of the first-stage driving chip, the control method includes:

loading a first enable signal to the multiplexing control pins of the driving chips cascaded to control the first sub-light source pin and the second sub-light source pin of the driving chip in each stage to transmit the address signal.

In one embodiment, before the step of the controller loading the display signal to the multiplexing control pin of the driving chip in each stage, the control method includes:

loading a second enable signal to the multiplexing control pins of the driving chips cascaded to control the multiplexing control pin, the first sub-light source pin, and the second sub-light source pin of the driving chip in each stage to transmit the display signal.

The present application provides a display module, including the light-emitting module mentioned above.

Advantages of the Present Application

The present application provides a light-emitting module, a control method thereof, and a display module, including: a substrate; a light source layer disposed on the substrate, wherein the light source layer includes a plurality of light source groups, and the light source groups include a first sub-light source and a second sub-light source; and a driving layer disposed on the substrate, wherein the driving layer includes cascaded driving chips connected in multiple stages, and each driving chip includes a first sub-light source pin electrically connected to the corresponding first sub-light source and a second sub-light source pin electrically connected to the corresponding second sub-light source. The first sub-light source pins and the second sub-light source pins of the cascaded driving chip in the present application are used for time-division multiplexing and transmission of the address signals and the display signals. That is to say, multiple first sub-light source pins and multiple second sub-light source pins are used for time-division multiplexing transmission of the address signals and the display signals, so as to prevent using separate pins to individually transmit the address signal or the display signal. Accordingly, the driving chip requires less pins, thereby reducing the production costs.

BRIEF DESCRIPTION OF DRAWINGS

The present application will be described with reference to the accompanying drawings. It should be noted that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
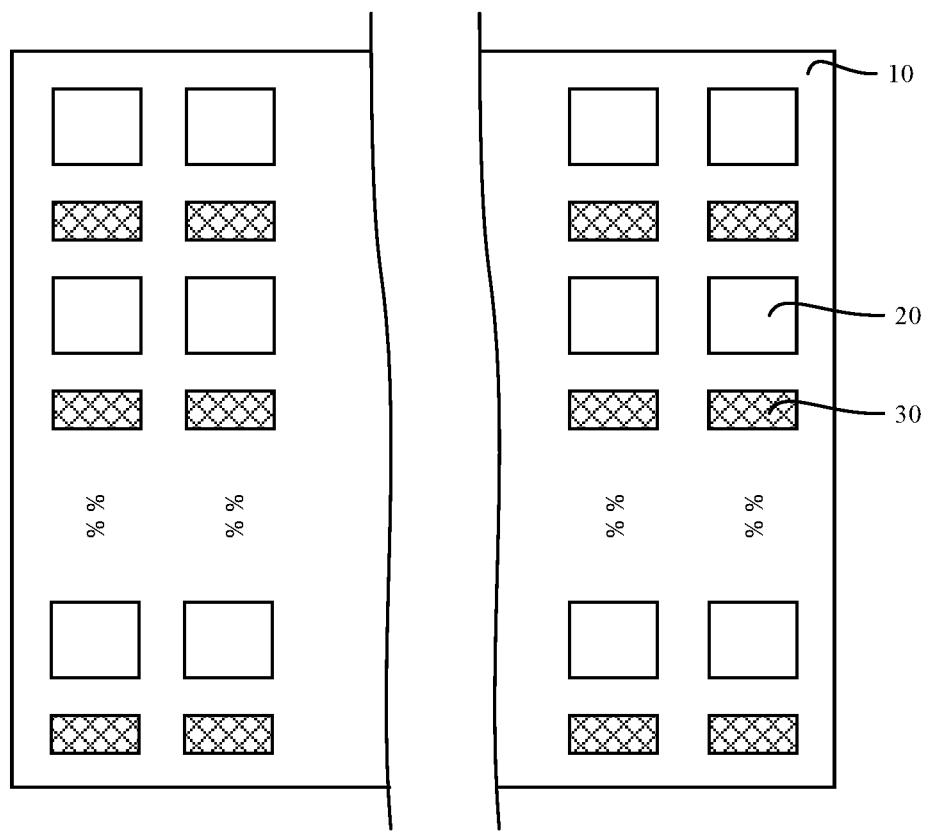
FIG. 1 is a schematic top view of a light-emitting module according to one embodiment of the present application.
Figure 2:
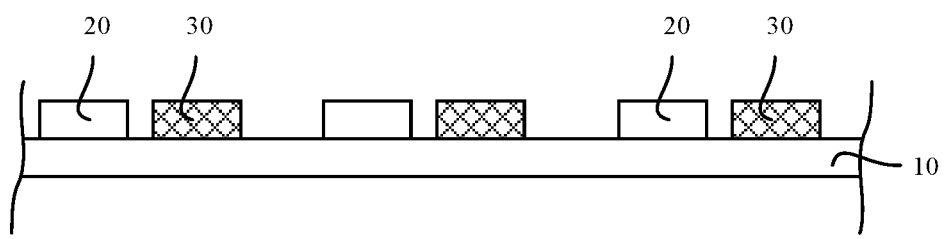
FIG. 2 is a schematic cross-sectional view of the light-emitting module in FIG. 1 according to one embodiment of the present application.

The technical solutions of the present application will be clearly and completely described below with reference to the accompanying drawings and in conjunction with specific embodiments of the present application. Obviously, the described embodiments are only some, but not all, embodiments of the present application. Based on the embodiments of the present application, all other embodiments obtained by those skilled in the art without creative efforts shall fall within the protection scope of the present application.

The terms "first", "second" and the like in the present application are used to distinguish different objects, rather than to describe a specific order. Furthermore, the terms "comprising", "including", and any variations thereof are intended to cover non-exclusive inclusion. For example, processes, methods, systems, products, or devices comprising a series of steps or modules are not limited to the listed steps or modules, but optionally also include unlisted steps or modules, or optionally also include other steps or modules inherent to these processes, methods, products, or devices.

Reference herein to an "embodiment" means that a particular feature, structure, or characteristic described in connection with the embodiment can be included in at least one embodiment of the present application. The appearance of this wording in various places in the specification does not necessarily all refer to the same embodiment, nor does it refer to separate or alternative embodiments that are mutually exclusive. It is explicitly and implicitly understood by those skilled in the art that the embodiments described herein can be combined with other embodiments.

The present application provides a light-emitting module, and the light-emitting module includes, but is not limited to, the following embodiments and combinations of the following embodiments.

In one embodiment, as shown in FIG. 2 to FIG. 6, the light-emitting module 100 includes: a substrate 10; a light source layer disposed on the substrate 10, wherein the light source layer includes a plurality of light source groups 20, and each of the light source groups 20 includes a first sub-light source 201 and a second sub-light source 202; and a driving layer disposed on the substrate 10, wherein the driving layer includes driving chips 30 cascaded in multiple stages, and each of the driving chips 30 includes a first sub-light source pin 301 electrically connected to the corresponding first sub-light source 201 and includes a second sub-light source pin 302 electrically connected to the corresponding second sub-light source 202. The first sub-light source pins 301 and the second sub-light source pins 302 are used for time-division multiplexing and transmission of address signals and display signals.

The substrate 10 can include, but is not limited to, a printed circuit board. The light source groups 20 can be fabricated on the substrate 10, and the cascaded driving chips 30 can be attached to the substrate 10. As shown in FIG. 1, the light source groups 20 can be arranged in an array or in other arrangements. Here, the light source groups 20 are arranged in an array along a row direction and in a column direction as an example for illustration. Furthermore, the cascaded driving chips 30 can correspond to the multiple light source groups 20 on a one-to-one basis. As shown in FIG. 1 to FIG. 6, each of the light source groups 20 can include multiple sub-light sources, and the sub-light sources include at least a first sub-light source 201 and a second sub-light source 202 (see FIG. 3 for example). Further, each of the driving chips 30 can include multiple sub-light source pins corresponding to the sub-light sources on a one-to-one basis. Each sub-light source is electrically connected to a corresponding one of the sub-light source pins. The sub-light source pins of each of the driving chips 30 include a first sub-light source pin 301 corresponding to one of the first sub-light sources 201 and includes a second sub-light source pin 302 corresponding to one of the second sub-light sources 202.

Figure 4:
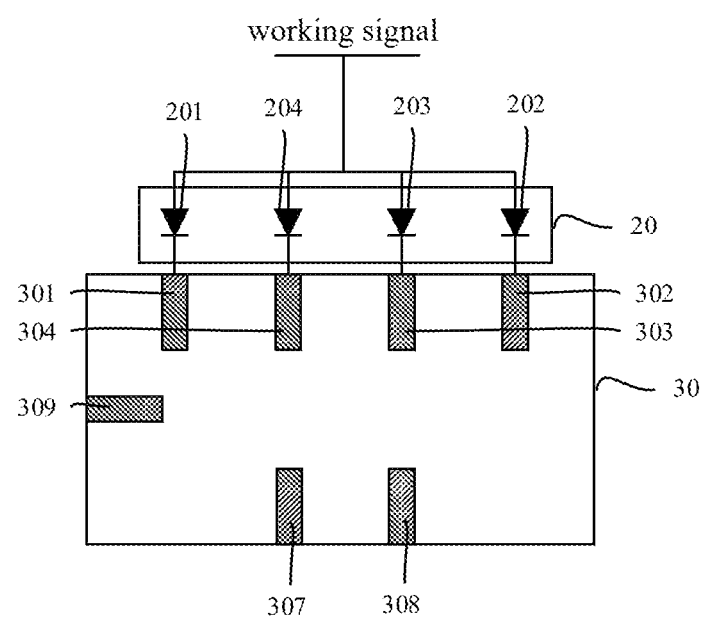
FIG. 4 is a schematic view of a connection relationship between another driving chip and a corresponding light source group according to one embodiment of the present application.

Specifically, in the present embodiment, the number of the sub-light sources of each light source group 20 and the number of the sub-light source pins 302 of each driving chip 30 are not limited. For example, as shown in FIG. 4, each light source group 20 can further include a third sub-light source 203 and a fourth sub-light source 204, and the corresponding driving chip 30 can further include a third sub-light source pin 303 corresponding to the third sub-light source 203 and a fourth sub-light source pin 304 corresponding to the fourth sub-light source 204. Specifically, each sub-light source in the present embodiment can include one light-emitting device or multiple light-emitting devices. The light-emitting device can include, but is not limited to, at least one of a light-emitting diode, a micrometer light-emitting diode, or a sub-millimeter light-emitting diode.

It can be understood that the first sub-light source pins 301 and the second sub-light source pins 302 of the cascaded driving chips 30 in the present embodiment can be used for time-division multiplexing and transmission of address signals and display signals. That is to say, for each of the driving chips 30, the first sub-light source pin 301 and the second sub-light source pin 302 can have the functions of transmitting both the address signal and the display signal. The "transmitting the address signal" can be understood as "the first sub-light source pin 301 or the second sub-light source pin 302 of the driving chip 30 of the current stage transmits the address signal to the first sub-light source pin 301 or the second sub-light source pin 302 of the next-stage driving chip 30". The "transmitting the display signal" can be understood as "the first sub-light source pin 301 of the driving chip 30 of each stage transmits the corresponding display signal to the corresponding second sub-light source 201, and the second sub-light source pin 302 of the driving chip 30 of each stage transmits the corresponding display signal to the second sub-light source 202. Therefore, in the present embodiment, by performing time-division multiplexing on the first sub-light source pins 301 and the second sub-light source pins 302, the present application can prevent using separate pins to individually transmit the address signal or the display signal, so that the present application can reduce production costs of the driving chips.

In one embodiment, as shown in FIG. 2 to FIG. 6, each of the driving chips 30 is configured to control the corresponding first sub-light source pin 301 and the corresponding second sub-light source pin 302 to transmit the address signal when powered on. To be specific, as shown in FIG. 3 to FIG. 6, the driving chip 30 further includes a plurality of power supply pins, and the power supply pins are used to supply power to the driving chip 30. The power supply pins of the driving chip 30 can include a first power supply pin 307 and a second power supply pin 308. The first power supply pins 307 of the cascaded driver chips 30 can be electrically connected to high voltage lines to load high-voltage signals. The second power supply pins 308 of the cascaded driving chips 30 can be electrically connected to a ground wire to be loaded with grounding signals. The driving chips 30 can work under the action of both the high voltage signals and the ground signals. After the cascaded driving chips 30 are powered on under the action of both the high-voltage signals and the grounding signals, the first sub-light source pins 301 and the second sub-light source pins 302 of the cascaded driving chips 30 can be initialized for transmitting the address signals.

Further, when the transmission of the address signals is completed, for example, after the driving chip 30 in each stage has obtained a corresponding address, the first sub-light source pins 301 and the second sub-light source pins 302 of the cascaded driving chips 30 are configured to transmit the display signals, so as to control the respective corresponding light source groups 20 to emit light.

Figure 5:
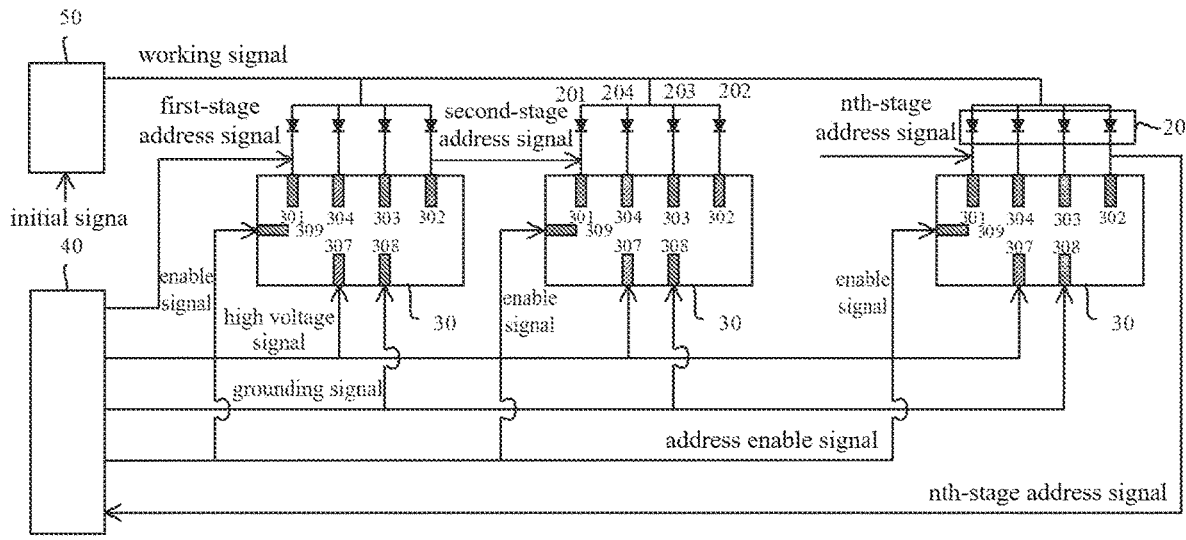
FIG. 5 is a schematic view showing a connection relationship between cascaded driving chips and multiple light source groups and illustrating a signal flow under an address enable signal according to one embodiment of the present application.
Figure 6:
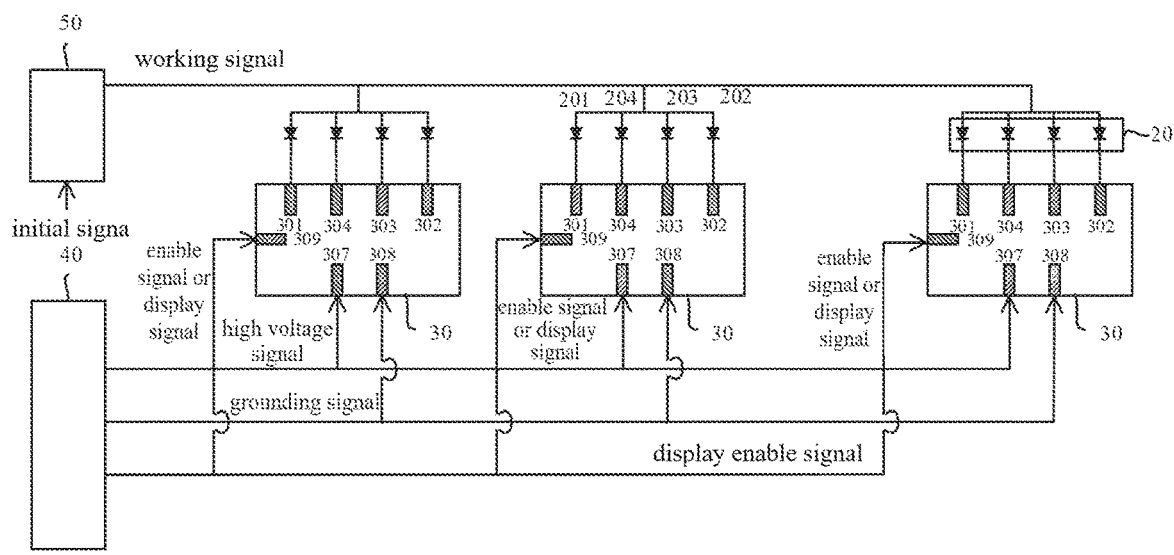
FIG. 6 is a schematic view showing a connection relationship between cascaded driving chips and multiple light source groups and illustrating a signal flow under a display enable signal according to one embodiment of the present application.

In one embodiment, as shown in FIG. 4 to FIG. 6, each driving chip 30 further includes a multiplexing control pin 309, and the multiplexing control pins 309 of the cascaded driving chips 30 are loaded with an enable signal. The enable signals control the first sub-light source pins 301 and the second sub-light source pins 302 of the cascaded driving chips 30 to transmit the address signals or the display signals.

It can be understood that each driving chip 30 in the present embodiment further includes the multiplexing control pin 309. The multiplexing control pins 309 of the cascaded driving chips 30 are loaded with the enable signals, so as to control the first sub-light source pins 301 and the second sub-light source pins 302 of the cascaded driving chips 30 to transmit the address signals or the display signals by controlling a specific content of the enable signal. That is to say, in each driving chip 30, the first sub-light source pin 301 and the second sub-light source pin 302 can determine, according to the specific content of the enable signal of the corresponding multiplexing control pin 309, whether it is the address signal or display signal that should be transmitted at this time. That is to say, the first sub-light source pins 301 and the second sub-light source pins 302 can allow time-division multiplexing transmission of the address signals and the display signals, so as to avoid having separate pins to individually transmit the address signal or the display signal, thereby reducing the production costs of the driving chips.

Specifically, in the present embodiment, the number of the driving chips 30 that can be controlled by the same enable signal is not limited. For example, as shown in FIG. 1 to FIG. 6, the multiple multiplexing control pins 309 of the cascaded driving chips 30 located in the same row can be electrically connected to be loaded with the same enable signal, and the enable signals can control all the cascaded driving chips 30 located in the same row to transmit the address signals or the display signals. In another example, the multiple multiplexing control pins 309 of the cascaded driving chips 30 which are located in the same column or randomly assigned can be electrically connected to be loaded with the same enable signal. In still another example, the multiplexing control pins 309 of all the driving chips 30 can also be electrically connected to be loaded with the same enable signal.

Specifically, no matter how the multiple first sub-light source pins 301 and the multiple second sub-light source pins 302 of the cascaded driving chips 30 are controlled to transmit the address signals, pins that are the same as or different from the multiplexing control pins 309 can be loaded with display enable signals when the transmission of the address signals is completed, so that the first sub-light source pins 301 and the second sub-light source pins 302 of the cascaded driving chips 30 are converted from "transmitting the address signals" to "transmitting the display signals", so as to control the corresponding light source groups 20 to emit light.

In one embodiment, as shown in FIG. 5 and FIG. 6, the light-emitting module 100 further includes: a controller 40 electrically connected to the first sub-light source pin 301 of the first-stage driving chip 30. The second sub-light source pin 302 of the driving chip 30 of the current stage is electrically connected to the first sub-light source pin 301 of the next-stage driving chip 30. When the first sub-light source pins 301 and the second sub-light source pins 302 are used to transmit the address signals, the controller 40 loads the first sub-light source pin 301 of the first-stage driving chip 30 with the first-stage address signal. The driving chip 30 of the current stage is used to generate the next-stage address signal according to the address signal of the current stage, and to transmit the next-stage address signal to the next-stage driving chip 30. The controller 40 can also be included in the driving layer. For example, the controller 40 can also be attached to the substrate 10.

The stage numbers like "the current stage" and "next stage" are used to describe the cascaded driving chips 30 loaded with the same enable signal. Here, the same enable signal is loaded to the driving chips 30 of n stages as an example for description. Specifically, when the enable signal controls the first sub-light source pins 301 and the second sub-light source pins 302 of the corresponding cascaded driving chips 30 to transmit the address signals, the first sub-light source pin 301 of the first-stage driving chip 30 can receive the first-stage address signal sent by the controller 40. Further, the first-stage driving chip 30 can process the first-stage address signal to generate a second-stage address signal and output the second-stage address signal to the first sub-light source pin 301 of the second-stage driving chip 30 via the second sub-light source pin 302 of the first-stage driving chip 30. The same analogy is applied, until the first sub-light source pin 301 of the $n_{th}$-stage driving chip 30 receives the $n_{th}$-stage address signal generated by the $(n-1)_{th}$-stage driving chip and output via the second sub-light source pin 302 of the $(n-1)_{th}$-stage driving chip. At this time, each one of the driving chips 30 of the n stages has obtained the corresponding address information.

Specifically, the above-mentioned "the driving chip 30 of the current stage is used to generate the next-stage address signal according to the address signal of the current stage" can be understood as that the driving chip 30 of the current stage can perform auto-increment, auto-decrement, or other arithmetic operations on the address signal of the current stage to generate the next-stage address signal. For example, the first-stage address signal can be "000001", and the first-stage driving chip 30 can add 1 to the first-stage address signal to become "000010" as the second-stage address information and transmit the second-stage address information to the second-stage driving chip 30.

Specifically, the first sub-light source pin 301 of the driving chip 30 of the current stage can be disposed close to the second sub-light source pin 302 of the driving chip 30 of the previous stage. The second sub-light source pin 302 of the driving chip 30 of the current stage can be disposed close to the first sub-light source pin 301 of the driving chip 30 of the next stage, so that the driving chip 30 of each stage is conveniently connected to the driving chip 30 of the previous stage and the driving chip 30 of the next stage by wires. For example, the first sub-light source pin 301 of each driving chip 30 can be located at one end of the multiple sub-light source pins, the second sub-light source pin 302 can be located at another end of the multiple sub-light source pins, and the rest sub-light source pins (including but not limited to the third sub-light source pin 303 and the fourth sub-light source pin 304) can be located between the first sub-light source pin 301 and the second sub-light source pin 302.

In one embodiment, as shown in FIG. 4 and FIG. 5, the first sub-light source pin 301 or the second sub-light source pin 302 of the last-stage driving chip 30 is electrically connected to the controller 40, so that the controller 40 confirms whether the transmission of the address signals is completed. Specifically, in combination with the above discussion, the first sub-light source pin 301 of the last-stage driving chip 30 can receive the last-stage address signal generated by the penultimate-stage driving chip 30. Because no driving chips 30 are provided behind the last-stage driving chip 30, the second sub-light source pin 302 of the last-stage driving chip 30 outputs the last-stage address signal like the first sub-light source pin 301 does, or outputs the address signal which is theoretically after the last-stage address signal.

It can be understood that, based on the above discussion, in the present embodiment, for example, the controller 40 can be electrically connected to the first sub-light source pin 301 of the last-stage driving chip 30. If the address signal acquired by the controller 40 is the last-stage address signal, it can be determined that the transmission of the address signals is completed; otherwise, it can be determined that the transmission of the address signals is not completed. Similarly, in another example, the controller 40 can be electrically connected to the second sub-light source pin 302 of the last-stage driving chip 30, and it can be determined whether the transmission of the address signals is completed according to the arrangement and the acquired signal of the second sub-light source pin 302 of the last-stage driving chip 30. It can be understood that the confirmation signal sent by the last-stage driving chip 30 to the controller 40 for determining whether the transmission of the address signals is completed can be generated by pre-processing the address signal, or it can be a preset specific signal. A content of the specific signal is independent of the address signal.

Furthermore, if it is determined that the transmission of the address signals is completed, the enable signal can be controlled to be a display enable signal, so as to configure the first sub-light source pins 301 and the second sub-light source pins 302 of the cascaded driving chips 30 to transmit the display signals to the corresponding light source groups 20, thereby controlling the corresponding light source groups 20 to emit light. Otherwise, the enable signal is maintained as an address enable signal, and the first sub-light source pins 301 and the second sub-light source pins 302 of the cascaded driving chips 30 are still configured to transmit the address signals.

In another embodiment, after the driving chip 30 in each stage transmits the address signal to the next-stage driving chip, the first sub-light source pin 301 and the second sub-light source pin 302 of the current-stage driving chip 30 transmit the display signals. At this point, there is no need for the controller to load the enable signal to each of the driving chips 30 in all stages.

Figure 3:
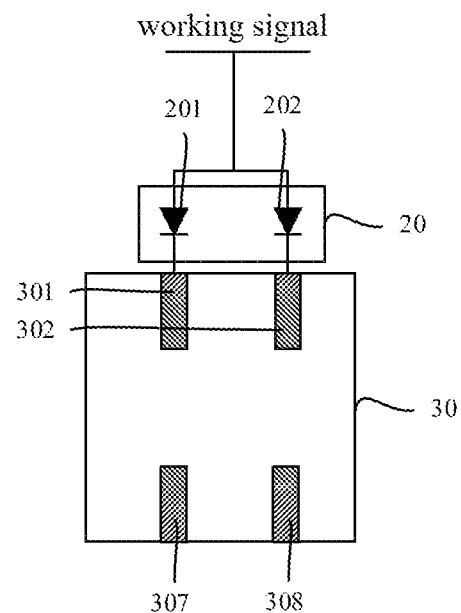
FIG. 3 is a schematic view of a connection relationship between a driving chip and a corresponding light source group according to one embodiment of the present application.

In one embodiment, as shown in FIG. 3, FIG. 4, and FIG. 6, when the first sub-light source pins 301 and the second sub-light source pins 302 are used to transmit the display signals, the controller 40 loads the display signal to the multiplexing control pin 309 of the driving chip 30 in each stage. In each driving chip 30, according to the address signal corresponding to the current stage, the driving chip 30 drives the corresponding first sub-light source 201 through the first sub-light source pin 301 to emit light and drives the corresponding second sub-light source 202 through the second sub-light source pin 302 to emit light.

Based on the above discussion, when the controller 40 determines that the transmission of the address signals is completed, the controller 40 can control the first sub-light source pins 301 and the second sub-light source pins 302 of the driving chips 30 to convert from "transmitting the address signals" to "transmitting the display signals" by controlling the enable signal to be a display enable signal or other methods. Specifically, as shown in FIG. 6, the multiplexing control pins 309 mentioned above can be used for multiplex transmission of the display signals. That is to say, the display signal generated by the controller 40 is input in parallel transmission to the multiplexing control pin 309 of the driving chip 30 of each stage. The driving chip 30 in each stage can obtain from the display signal a portion of the display signal corresponding to the current stage according to the address information of the corresponding stage (the current stage). In detail, for example, the first sub-light source pin 301 can obtain a partial signal corresponding to the first sub-light source 201 from a portion of the display signal corresponding to the current stage, so as to drive the corresponding first sub-light source 201 to emit light. This is similar for the second sub-light source pin 302, and details can refer to the descriptions about the first sub-light source pin 301.

Further, based on the above discussion, the driving chip 30 of each stage obtains the address signal of the corresponding stage (this stage), and the display signal can include a valid address mark and a valid display signal corresponding to each of the cascaded driving chips 30. For example, there is a corresponding valid display signal after each valid address mark, and the driving chip 30 in each stage can acquire the same and complete display signal. Therefore, the driving chip 30 of each stage can acquire from the display signal to generate the valid display signal corresponding to the valid address mark that is the same as or related to the corresponding address signal, and transmit the valid display signal to the corresponding sub-light source pins, thereby controlling lighting of the sub-light sources.

In one embodiment, as shown in FIG. 4 to FIG. 6, the light-emitting module 100 further includes: a voltage conversion chip 50 electrically connected to the light source groups 20. The voltage conversion chip 50 and the corresponding first sub-light source pin 301 control the corresponding first sub-light source 201 to emit light. The voltage conversion chip 50 and the corresponding second sub-light source pin 302 control the corresponding second sub-light source 202 to emit light.

Specifically, as shown in FIG. 4 to FIG. 6, the voltage conversion chip 50 can convert an initial signal into a working signal by including, but not limited to, voltage conversion. Each sub-light source (e.g., the first sub-light source 201, the second sub-light source 202, the third sub-light source 203, and the fourth sub-light source 204) of the light source group 20 are also electrically connected to the voltage conversion chip 50 to be loaded with the working signal. Each sub-light source emits light under the action of the working signal and the action of the voltage of the corresponding sub-light source pin. For example, the sub-light sources can include sub-millimeter light-emitting diodes or micro-LEDs or both. Either cathodes or anodes of the sub-light sources can be electrically connected to the same working line to load the same working signal, while the other cathodes or anodes of the sub-light sources can be electrically connected to the corresponding sub-light source pins to emit light.

Figure 7:
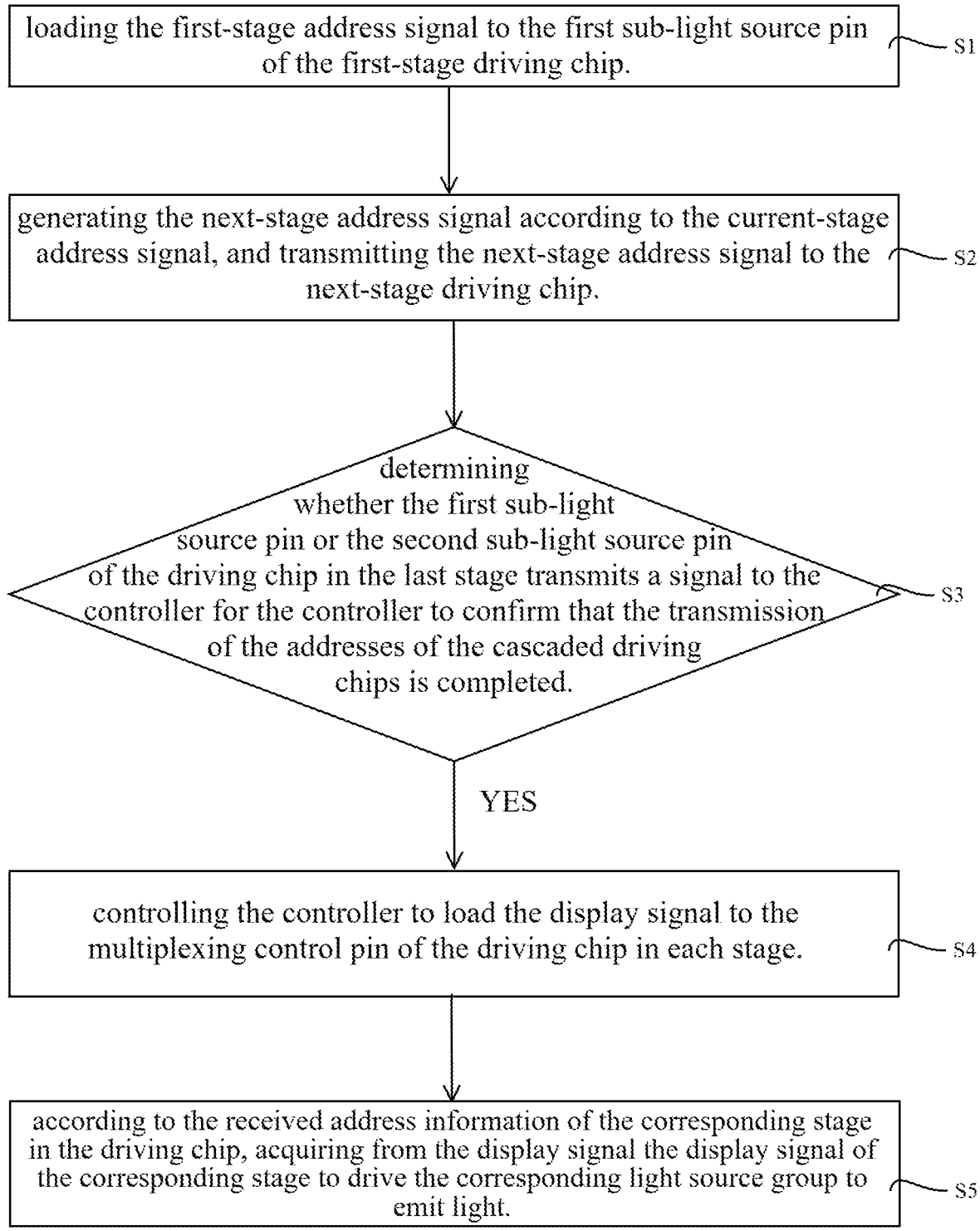
FIG. 7 is a process flow diagram illustrating a control method for controlling the light-emitting module according to one embodiment of the present application.

The present application provides a control method for controlling any light-emitting module described above. The driving chip further includes a multiplexing control pin. As shown in FIG. 7, the control method can include, but is not limited to, the following steps and combinations of the following steps.

S1: loading the first-stage address signal to the first sub-light source pin of the first-stage driving chip.

In can be known from the above discussion that when the cascaded driving chips are powered on under the action of both a high-voltage signal and a grounding signal, the enable signal can be initialized as an address enable signal. The first sub-light source pins and the second sub-light source pins of the cascaded driving chips are used to transmit the address signals. Specifically, the control system can control the controller to load the first-stage address signal to the first sub-light source pin of the first-stage driving chip. Certainly, according to the above discussion, it can be known that the first-stage address signal can be loaded to any sub-light source pin of the first-stage driving chip, that is, to any sub-light source pin and not limited to the first sub-light source pin.

S2: generating the next-stage address signal according to the current-stage address signal, and transmitting the next-stage address signal to the next-stage driving chip.

Specifically, it can be known from the above discussion that after the first sub-light source pin of the first-stage driving chip is loaded with the first-stage address signal, a control system can control the first-stage driving chip to process the first-stage address signal to generate the second-stage address signal, and output the second-stage address signal to the first sub-light source pin of the second-stage driving chip via the second sub-light source pin of the first-stage driving chip. In the driving chip of each stage, the next-stage address signal is generated according to the current-stage address signal and transmitted to the next-stage driving chip. The same analogy is applied, until the first sub-light source pin of the $n_{th}$-stage driving chip 30 receives the $n_{th}$-stage address signal generated by the $(n-1)_{th}$-stage driving chip and output via the second sub-light source pin of the $(n-1)_{th}$-stage driving chip. At this point, each one of the driving chips of the n stages has obtained the corresponding address information.

Furthermore, according to the above discussion, it can be known that the first sub-light source pin or the second sub-light source pin of the driving chip in the last stage is electrically connected to the controller, so that the controller can confirm whether the transmission of the address signals is completed.

S3: determining whether the first sub-light source pin or the second sub-light source pin of the driving chip in the last stage transmits a signal to the controller for the controller to confirm that the transmission of the addresses of the cascaded driving chips is completed.

Based on the above discussion, the confirmation signal, sent by the last-stage driving chip to the controller for determining whether the transmission of the address signals is completed, can be generated after pre-processing the address signal or can be a preset specific signal. The content of the specific signal is independent of the address signal.

Further, based on the above discussion, in one example, the controller is electrically connected to the first sub-light source pin of the last-stage driving chip. If the acquired address signal is the last-stage address signal, it can be determined that the transmission of the address signals is completed; otherwise, it can be determined that the transmission of the address signals is not yet completed. Similarly, in another example, the controller is electrically connected to the second sub-light source pin of the last-stage driving chip. By determining whether the acquired address signal is the last-stage address signal or by determining whether the acquired address signal is a signal related to the last-stage address signal according to the actually acquired signal and the arrangement of the second sub-light source pin of the last-stage driving chip, it can be determined whether the transmission of the address signals is completed.

It can be understood that, in another embodiment, after the driving chip 30 of each stage transmits an address signal to the next-stage driving chip, the first sub-light source pin 301 and the second sub-light source pin 302 of the current-stage driving chip 30 are used to transmit the display signal. At this point, the controller does not need to load the enable signal to the driving chip 30 of each stage.

If the first sub-light source pin or the second sub-light source pin of the last-stage driving chip transmits a signal to the controller for the controller to confirm that the transmission of the addresses of the cascaded driving chips is completed, the execution includes but is not limited to the following steps.

S4: controlling the controller to load the display signal to the multiplexing control pin of the driving chip in each stage.

If the first sub-light source pin or the second sub-light source pin of the last-stage driving chip transmits a signal to the controller for the controller to confirm that transmission of the addresses of the cascaded driving chips is completed, it is determined that the transmission of the address signals is completed. Based on the above discussion, the enable signal can be controlled as the display enable signal for example, so as to set the first sub-light source pins and the second sub-light source pins of the cascaded driving chips to transmit the display signals.

Specifically, based on the above discussion, "setting the first sub-light source pins, the second sub-light source pins, and the multiplexing control pins of the cascaded driving chips to transmit the display signals" can be understood as "the display signal generated by the controller is input in parallel transmission to the multiplexing control pin of the driving chip in each stage, and the driving chip in each stage can obtain from the display signal a portion of the display signal corresponding to the current stage (this stage) according to the address information of the corresponding stage (this stage)".

Certainly, in the driving chip in any stage, as soon as the corresponding first sub-light source pin and the corresponding second sub-light source pin have completed the transmission of the current-stage address signal and the next-stage address signal, the signal of the multiplexing control pin of this stage alone can be set as the display enable signal.

On the contrary, based on the above discussion, if the first sub-light source pin or the second sub-light source pin of the last-stage driving chip does not transmit a signal to the controller for the controller to confirm that the transmission of the addresses of the cascaded driving chips is completed, then it is determined that the transmission of the address signals is not yet completed, and the enable signal is maintained as the address enable signal, so the first sub-light source pins and the second sub-light source pins of the cascaded driving chips are still set to transmit the address signals.

S5: according to the received address information of the corresponding stage in the driving chip, acquiring from the display signal the display signal of the corresponding stage to drive the corresponding light source group to emit light.

Based on the above discussion, when it is determined that the transmission of the address signals is completed, the first sub-light source pins and the second sub-light source pins of the cascaded driving chips can be set at the same time to transmit the display signals. Specifically, after the driving chip in each stage acquires from the display panel a portion of the display signal corresponding to this stage according to the address information of the corresponding stage, the first sub-light source pin can acquire a portion of the signal corresponding to the first sub-light source from the portion of the display signal corresponding to this stage, so as to drive the corresponding first sub-light source to emit light. This is similar for the second sub-light source pin, and details can refer to the descriptions about the first sub-light source pin.

Further, based on the above discussion, the driving chip in each stage has acquired the address signal of the corresponding stage, and the display signal can include multiple valid address marks corresponding to the respective driving chips connected in cascade and multiple valid display signals corresponding to the respective driving chips connected in cascade. For example, there is a corresponding one of the valid display signals after each valid address mark, and the driving chip in each stage can acquire the same and complete display signal. Therefore, the driving chip of each stage can acquire from the display signal to generate the valid display signal corresponding to the valid address mark that is the same as or related to the corresponding address signal, and transmit the valid display signal to the corresponding sub-light source pins, thereby controlling lighting of the sub-light sources.

In one embodiment, before step S1, the following steps can be included but not limited to:

S0: loading a first enable signal to the multiplexing control pins of the cascaded driving chips to control the first sub-light source pin and the second sub-light source pin of the driving chip in each stage to transmit the address signal.

Based on the above discussion, the multiplexing control pins of the cascaded driving chips in a same row can be electrically connected to be loaded with the same enable signal. Each enable signal can control the cascaded driving chips in the same row to transmit the address signals or the display signals. When the cascaded driving chips are powered on, a specific content of the enable signal transmitted by the multiplexing control pins can be combined. Specifically, when the enable signal is the address enable signal, the first sub-light source pin and the second sub-light source pin of the driving chip of each stage are controlled to transmit the address signal, so as to execute step S2.

In one embodiment, before step S4, the following steps and combinations of the following steps can be included but not limited to:

S6: loading a second enable signal to the multiplexing control pins of the cascaded driving chips to control the multiplexing control pin, the first sub-light source pin, and the second sub-light source pin of the driving chip in each stage to transmit the display signal.

Similarly, referring to the relevant description of step S0 above, when the enable signal is the display enable signal, then on the one hand, the multiplexing control pin of the driving chip of each stage can be controlled to transmit the display signal, so as to execute step S4. On the other hand, the first sub-light source pin and the second sub-light source pin of the driving chip in each stage can be controlled to transmit the display signal, so as to execute step S5.

The present application provides a display module, including the light-emitting module in any embodiment described above. Specifically, the light-emitting module of the present application can be used as a backlight module or a light-emitting device layer of the display module.

The present application provides a light-emitting module, a control method thereof, and a display module, including: a substrate; a light source layer disposed on the substrate, wherein the light source layer includes a plurality of light source groups, and the light source groups include a first sub-light source and a second sub-light source; and a driving layer disposed on the substrate, wherein the driving layer includes cascaded driving chips connected in multiple stages, and each driving chip includes a first sub-light source pin electrically connected to the corresponding first sub-light source and a second sub-light source pin electrically connected to the corresponding second sub-light source. The first sub-light source pins and the second sub-light source pins of the cascaded driving chip in the present application are used for time-division multiplexing of the address signals and the display signals. That is, multiple first sub-light source pins and multiple second sub-light source pins are used for time-division multiplexing transmission of the address signals and the display signals, so as to prevent using separate pins to individually transmit the address signal or the display signal. Accordingly, the driving chip requires less pins, thereby reducing the production costs.

The light-emitting module, the control method thereof, and the display module of the present application have been introduced in detail above. In the present disclosure, specific examples are used to illustrate the working principles and embodiments of the present application. The descriptions of the above embodiments are only used for ease of understanding the technical solution and main ideas of the present application. Those of ordinary skill in the art should understand that modifications can be made to the technical solutions of the foregoing embodiments, or equivalent replacements can be made for some of the technical features. Such modifications or replacements do not deviate from the protection scope of the technical solutions of the embodiments of the present application.

What is claimed is:

1. A light-emitting module, comprising:
a substrate;
a light source layer disposed on the substrate, wherein the light source layer comprises a plurality of light source groups, and each of the light source groups comprises a first sub-light source and a second sub-light source; and
a driving layer disposed on the substrate, wherein the driving layer comprises driving chips cascaded in multiple stages, and each of the driving chips comprises a first sub-light source pin electrically connected to a corresponding one of the first sub-light sources and a second sub-light source pin electrically connected to a corresponding one of the second sub-light sources;
wherein the first sub-light source pins and the second sub-light source pins of the driving chips cascaded are configured for time-division transmission of address signals and display signals;
wherein each of the driving chips further comprises a multiplexing control pin, and the multiplexing control pins of the driving chips cascaded are loaded with an enable signal;
wherein the enable signal controls the first sub-light source pins and the second sub-light source pins of the driving chips cascaded to transmit the address signals or the display signals.

2. The light-emitting module according to claim 1, wherein each of the driving chips is configured to control the first sub-light source pin and the second sub-light source pin of this driving chip to transmit the address signals when powered on.

3. A control method for controlling the light-emitting module of claim 2, each of the driving chips further comprises a multiplexing control pin; the control method comprises:
loading the first-stage address signal to the first sub-light source pin of the first-stage driving chip;
generating the next-stage address signal according to the current-stage address signal, and transmitting the next-stage address signal to the next-stage driving chip;
if the first sub-light source pin or the second sub-light source pin of the last-stage driving chip transmits a signal to the controller for the controller to confirm that the transmission of the address signals of the driving chips cascaded is completed, then the controller loading the display signal to the multiplexing control pin of the driving chip in each stage; and
in each of the driving chips, according to the received address signal of the current stage, acquiring from the display signal the display signal of the current stage to drive the corresponding light source group to emit light.

4. The control method for controlling the light-emitting module according to claim 3, wherein before the step of loading the first-stage address signal to the first sub-light source pin of the first-stage driving chip, the control method comprises:
loading a first enable signal to the multiplexing control pins of the driving chips cascaded to control the first sub-light source pin and the second sub-light source pin of the driving chip in each stage to transmit the address signal.

5. The control method for controlling the light-emitting module according to claim 3, wherein before the step of the controller loading the display signal to the multiplexing control pin of the driving chip in each stage, the control method comprises:
loading a second enable signal to the multiplexing control pins of the driving chips cascaded to control the multiplexing control pin, the first sub-light source pin, and the second sub-light source pin of the driving chip in each stage to transmit the display signal.

6. The light-emitting module according to claim 1, wherein the driving layer further comprises:

a controller electrically connected to the first sub-light source pin of a first-stage driving chip;

wherein the second sub-light source pin of a current-stage driving chip is electrically connected to the first sub-light source pin of a next-stage driving chip; and wherein when the first sub-light source pins and the second sub-light source pins are used to transmit the address signals, the controller loads the first-stage address signal to the first sub-light source pin of the first-stage driving chip, and the current-stage driving chip is configured to generate a next-stage address signal according to a current-stage address signal and transmit the next-stage address signal to the next-stage driving chip.

7. The light-emitting module according to claim 6, wherein the first sub-light source pin or the second sub-light source pin of a last-stage driving chip is electrically connected to the controller, so that the controller confirms whether the transmission of the address signals is completed.

8. The light-emitting module according to claim 6, wherein when the first sub-light source pins and the second sub-light source pins are configured to transmit the display signals, the controller loads the display signal to the multiplexing control pin of the driving chip in each stage; and wherein in each of the driving chips, according to the address signal corresponding to the current stage, the driving chip drives the corresponding first sub-light source through the first sub-light source pin to emit light and drives the corresponding second sub-light source pin through the second sub-light source pin to emit light.

9. The light-emitting module according to claim 1, wherein each of the light source groups further includes a third sub-light source, and each of the driving chips further includes a third sub-light source pin electrically connected to a corresponding one of the third sub-light sources; and wherein in each of the driving chips, the third sub-light source pin is disposed between the first sub-light source pin and the second sub-light source pin.

10. A display module, comprising a light-emitting module, the light-emitting module comprising:

a substrate;

a light source layer disposed on the substrate, wherein the light source layer comprises a plurality of light source groups, and each of the light source groups comprises a first sub-light source and a second sub-light source; and a driving layer disposed on the substrate, wherein the driving layer comprises driving chips cascaded in multiple stages, and each of the driving chips comprises a first sub-light source pin electrically connected to a corresponding one of the first sub-light sources and a second sub-light source pin electrically connected to a corresponding one of the second sub-light sources;

wherein the first sub-light source pins and the second sub-light source pins of the driving chips cascaded are configured for time-division transmission of address signals and display signals;

wherein each of the driving chips further comprises a multiplexing control pin, and the multiplexing control pins of the driving chips cascaded are loaded with an enable signal;

wherein the enable signal controls the first sub-light source pins and the second sub-light source pins of the driving chips cascaded to transmit the address signals or the display signals.

11. The display module according to claim 10, wherein each of the driving chips is configured to control the first sub-light source pin and the second sub-light source pin of this driving chip to transmit the address signal when powered on.

12. The display module according to claim 10, wherein the driving layer further comprises:

a controller electrically connected to the first sub-light source pin of the first-stage driving chip;

wherein the second sub-light source pin of the current-stage driving chip is electrically connected to the first sub-light source pin of the next-stage driving chip; and wherein when the first sub-light source pins and the second sub-light source pins are used to transmit the address signals, the controller loads the first-stage address signal to the first sub-light source pin of the first-stage driving chip, and the current-stage driving chip is configured to generate the next-stage address signal according to the current-stage address signal and transmit the next-stage address signal to the next-stage driving chip.

13. The display module according to claim 12, wherein the first sub-light source pin or the second sub-light source pin of the last-stage driving chip is electrically connected to the controller, so that the controller confirms whether the transmission of the address signals is completed.

14. The display module according to claim 12, wherein when the first sub-light source pins and the second sub-light source pins are configured to transmit the display signals, the controller loads the display signal to the multiplexing control pin of the driving chip in each stage; and wherein in each of the driving chips, according to the address signal corresponding to the current stage, the driving chip drives the corresponding first sub-light source through the first sub-light source pin to emit light and drives the corresponding second sub-light source pin through the second sub-light source pin to emit light.

15. The display module according to claim 10, wherein each of the light source groups further includes a third sub-light source, and each of the driving chips further includes a third sub-light source pin electrically connected to a corresponding one of the third sub-light sources; and wherein in each of the driving chips, the third sub-light source pin is disposed between the first sub-light source pin and the second sub-light source pin.

* * * * *